United States Patent
Honbo et al.

[19]

[11] Patent Number: 6,087,757
[45] Date of Patent: Jul. 11, 2000

[54] DRIVING METHOD AND DRIVING CIRCUIT OF PIEZOELECTRIC TRANSFORMERS

[75] Inventors: Nobuaki Honbo; Shingo Kawashima, both of Tokyo, Japan

[73] Assignee: NEC Corporation, Tokyo, Japan

[21] Appl. No.: 09/098,548

[22] Filed: Jun. 17, 1998

[30] Foreign Application Priority Data

Jun. 19, 1997 [JP] Japan ...................................... 9-162781

[51] Int. Cl.$^7$ ..................................................... H01L 41/08
[52] U.S. Cl. .................... 310/316.01; 310/318; 315/277; 315/DIG. 5
[58] Field of Search .............................. 310/316.01, 317, 310/318, 319; 315/224, 276, 277, DIG. 5; 363/78; 323/299

[56] References Cited

U.S. PATENT DOCUMENTS

| | | | |
|---|---|---|---|
| 3,707,636 | 12/1972 | Inoue | 310/318 |
| 4,459,505 | 7/1984 | Lim | 310/318 |
| 5,731,652 | 3/1998 | Shimada | 310/316.01 |
| 5,739,622 | 4/1998 | Zaitsu | 310/317 X |
| 5,796,213 | 8/1998 | Kawasaki | 310/316.01 X |
| 5,886,514 | 3/1999 | Iguchi | 310/318 X |
| 5,894,184 | 4/1999 | Furuhashi et al. | 310/316.01 |

FOREIGN PATENT DOCUMENTS

| | | |
|---|---|---|
| 2-97916 | 4/1990 | Japan . |
| 6-20783 | 1/1994 | Japan . |
| 8-33349 | 2/1996 | Japan . |
| 8-47265 | 2/1996 | Japan . |
| 8-275553 | 10/1996 | Japan . |

*Primary Examiner*—Mark O. Budd
*Attorney, Agent, or Firm*—Whitham, Curtis & Whitham

[57] ABSTRACT

A driving circuit of the present invention includes first and second piezoelectric transformers 12, 14 for outputting a voltage at a secondary terminal which is input from a primary terminal utilizing a piezoelectric effect, frequency control means 21 for outputting a frequency signal for operating the first piezoelectric transformer 12 at a required frequency voltage, phase reversing means 16 for reversing a phase of the frequency signal by 180 degrees, driving circuits 13, 15 for applying a frequency voltage to each of the piezoelectric transformers 12, 14 based on these frequency signals of which phases are different from each other by 180 degrees, a discharge tube 11 in which an output of the first piezoelectric transformer 12 is applied to a first input terminal and an output of the second piezoelectric transformer 14 is applied to a second input terminal, a circuit 20 for controlling a voltage of the first piezoelectric transformer 12 so that a current flowing in this discharge tube becomes to be constant, and circuits 22, 17 for controlling a voltage input to the second piezoelectric transformer 14 so that output voltages of the first and second piezoelectric transformers become to be the same voltages.

14 Claims, 11 Drawing Sheets

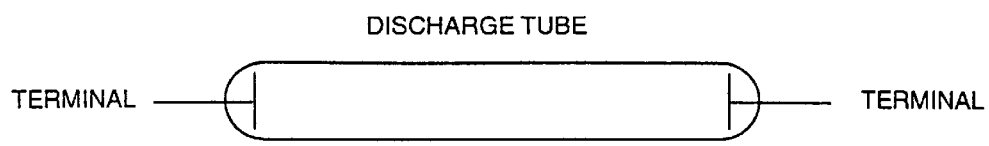
FIG.3A
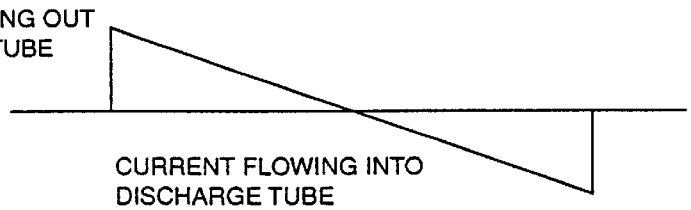
FIG.3B
FIG.3C

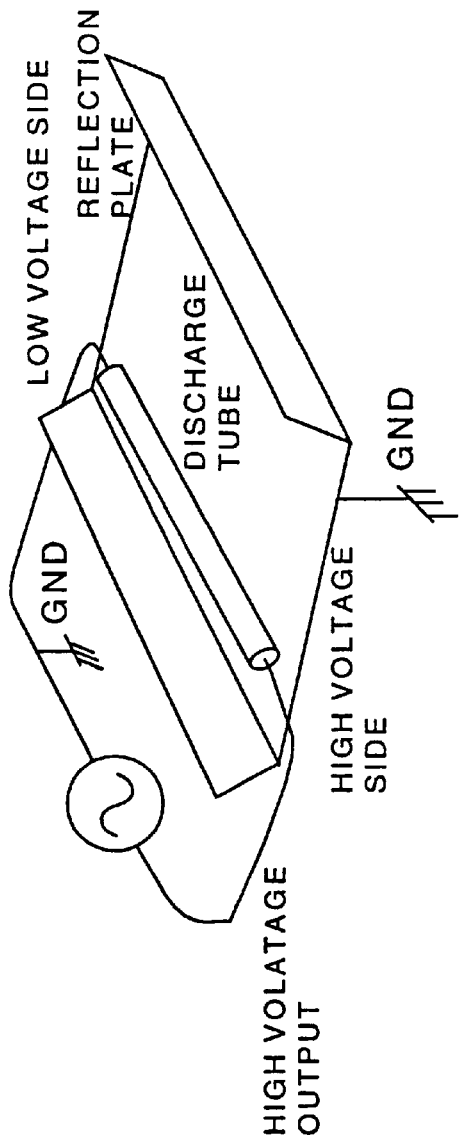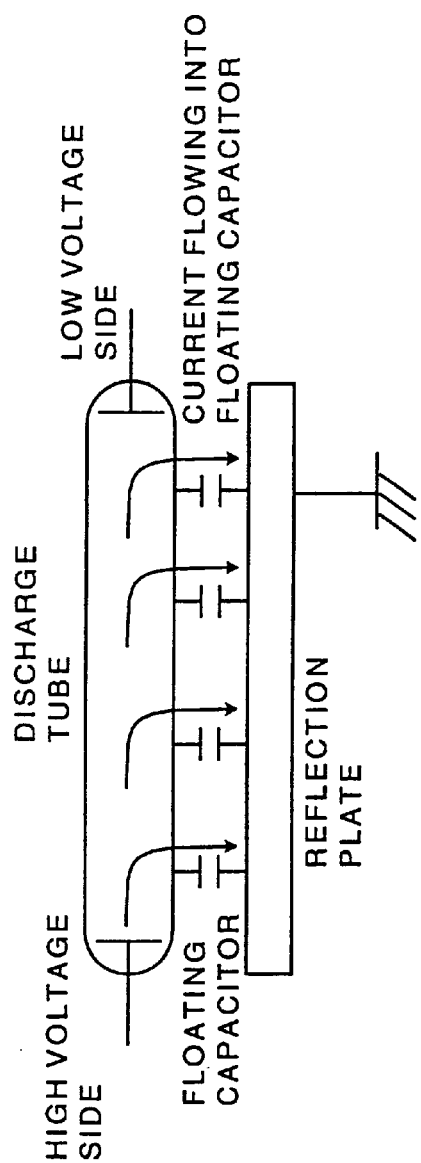
FIG. 10 A
FIG. 10 B

6,087,757

DRIVING METHOD AND DRIVING CIRCUIT OF PIEZOELECTRIC TRANSFORMERS

BACKGROUND OF THE INVENTION

The present invention relates to a driving technology for piezoelectric transformers that transform a voltage from a direct current voltage supply into a predetermined voltage using a piezoelectric effect, and more particularly, to a driving method and a driving circuit of piezoelectric transformers for constituting a power supply circuit for effectively turning on a discharge tube using the piezoelectric transformers.

Conventionally, as a power supply circuit for turning on a discharge tube, a driving circuit using a piezoelectric transformer was proposed. As a technology for driving such a piezoelectric transformer, a driving circuit was proposed, in which the piezoelectric transformer was driven by a sinusoidal wave of a transmission wave and an output of this piezoelectric transformer was input from one side of a load. See for example JP-A-275553/1996. In this driving circuit, as shown in FIG. 4, secondary sides of two autotransformers 33 and 34 are connected to two primary electrodes of the piezoelectric transformer 31, and primary sides of the autotransformers 33 and 34 are connected to a power voltage Vdd. Further, switching transistors 37 and 38 are connected to intermediate terminals of the autotransformers 33 and 34, a current flowing in a load 32 is detected and a drive frequency of the piezoelectric transformer 31 is determined by a frequency control circuit 35, and the drive frequency is input to a two phase driving circuit 36. By an output from this two phase driving circuit 36, the switching transistors 37 and 38 are alternately switched at a resonance frequency of the piezoelectric transformer 31. Primary and secondary inductances of these autotransformers 37 and 38 and an equivalent input capacity of the piezoelectric transformer 31 are set to construct a resonance circuit. In the circuit, two phases half wave sinusoidal waves shown in the figure are generated, and by alternately applying these two half wave sinusoidal waves to two primary side electrodes 31a and 31b of the piezoelectric transformer 31, a sinusoidal wave is applied to the primary side electrodes of the piezoelectric transformer 31. In this manner, the piezoelectric transformer 31 can apply a boosted output voltage to the load 32. Also, as other prior arts, a technology is shown, in which a half wave sinusoidal wave in JP-A-33349/1996 or a rectangular wave in JP-A-47265/1996 is input to a primary side of a piezoelectric transformer and an output therefrom is input to one side of a load.

On the other hand, as a driving circuit for turning on a discharge tube such as a cold cathode fluoresce lamp using an electromagnetic transformer, and further reducing luminance non-uniformity of the discharge tube, the technology thereof is disclosed in JP-A-20783/1994. In this circuit, as shown in FIG. 5, a periodicity signal such as a horizontal synchronizing signal of a video signal is input to a current control circuit 42 and a pulse direction control circuit 45 from a terminal 41. Also, an output from the current control circuit 42 is input to a gate of a switching element 43. A source side of this switching element 43 is grounded, and a drain side is connected to one end of a first primary winding 44a and the other end of a second primary winding 44b of a transformer 44. Outputs of the pulse direction control circuit 45 are a switching signal Q that is reversed every predetermined period of the horizontal synchronizing signal, and a signal Qbar with a phase opposite to that of the signal Q, and Q and Qbar are input to a base of a transistor 46a and a base of a transistor 46b, respectively. Collectors of the transistors 46a and 46b are connected to a power supply, and emitters thereof are connected to the other end of the first primary winding 44a and one end of the second primary winding 44b, respectively. One end of a secondary winding 44c of the transformer 44 is connected to one electrode of a discharge tube 47 and the other end of the secondary winding 44c is connected to the other electrode of the discharge tube 47.

In this circuit arrangement, if a signal as shown in FIG. 6A is input from the terminal 41, a signal as shown in FIG. 6B is supplied to the gate of the switching element 43 from the current control circuit 42, and switching signals as shown in FIGS. 6C and 6D are formed from the pulse direction control circuit 45, which are reversed at an intermediate position of the signal of FIG. 6A. By supplying the signal of FIG. 6C to the base of the transistor 46a and supplying the signal of FIG. 6D to the base of the transistor 46b, respectively, a current alternately flows in the first primary winding 44a and the second primary winding 44b. Since the first primary winding 44a and the second primary winding 44b are wound in a direction opposite to each other, a pulse voltage that is reversed every predetermined period as shown in FIG. 6E occurs between one end and the other end of the secondary winding 44c of the transformer 44, and this voltage is applied to one side and the other side of the discharge tube 47.

In addition to this, as a prior art for reducing luminance non-uniformity of a backlight of a liquid crystal panel, a technology thereof is disclosed in JP-A-27918/1990. FIG. 7 is a circuit diagram thereof, and on a reverse surface of the liquid crystal panel, the number M (M is an integer of one or more than one) of discharge tubes TM are arranged in a direction extending along a line, and a converter 51, a low frequency pulse generator 52 and a tube control signal generator 53 are provided in each of the discharge tubes. In an arrangement of the circuit, the converter 51 is connected to the discharge tube T1, and a DC voltage VO is input so as to be able to apply a rectangular wave of a high frequency voltage with a period THF as shown in FIG. 8C for example to the discharge tube T1. A low frequency control signal VBF as shown in FIG. 8B is input to the converter 51, which creates a change of the luminance of the discharge tube T1. The low frequency control signal VBF is a low frequency period pulse having a chop speed TBF/Tm that is adjustable and modulates a high frequency voltage VHF applied to the discharge tube T1. Also, the low frequency control signal VBF is generated by the low frequency pulse generator 52 based on a control signal ST input from the tube control signal generator 53. And, the signal ST is input to a first input of a comparator 55 through an integrator 54. An output signal VS from a slope generator 56, as shown in FIG. 8A, is input to a second input of the comparator 55. An output voltage Vm of the integrator 54 is compared with the slope signal VS, and the low frequency control signal VBF as shown in FIG. 8B is generated. When the voltage ST changes, the voltage Vm changed in accordance with-the change, and a pulse width Tm of the low frequency rectangular wave signal VBF changes. By means of this signal VBF, the voltage VHF applied to the discharge tube T1 is controlled. Through this control, luminance LT of the discharge tube T1 is continuously modulated as shown in FIG. 8D. Also, average luminance of the discharge tube T1 is presented as LTm of FIG. 8D. FIG. 9A to FIG. 9D indicate the same signals as in FIG. 8A to FIG. 8D in case that the control signal ST changes. In FIG. 9, by changing a value of a modulation time Tm, duration of the voltage VHF applied to the discharge tube T1 is changed. This control is conducted for the number M of discharge tubes TM arranged in a direction extending along a line on the reverse surface of the liquid crystal panel, and luminance non-uniformity of the entire liquid crystal panel is reduced.

The first task in the above prior arts is that in case the load is a discharge tube and a piezoelectric transformer is driven as disclosed in the above-described JP-A-275553/1996, JP-A-33349/1996 and JP-A-47285/1996, a high voltage is applied to only one side of the discharge tube and the discharge tube is turned on, luminance of a low voltage side of the discharge tube to which the high voltage is not applied is low and luminance non-uniformity between a high voltage side and the low voltage side of the discharge tube occurs. This phenomenon occurs like in an electromagnetic transformer and occurs even though the discharge tube is turned on like in the manner as disclosed in JP-A-20783/1994. Also, like in JP-A-27916/1990 for example, this phenomenon occurs in case that a high voltage is input to one side of a discharge tube used in a liquid crystal panel, and luminance of the liquid crystal panel is controlled to be constant by changing an application period of time when the high voltage is applied to a predetermined number of discharge tubes. The reason thereof is that due to a floating capacitor formed between the discharge tube and a reflection plate of the discharge tube, a current flowing in the discharge tube flows into the reflection plate. A structure of a backlight in which a discharge tube is placed right below is shown in FIG. 10A. Therefore, as shown in FIG. 10B, a floating capacitor is formed between the discharge tube and the reflection plate of the discharge tube, and a current becomes to flow into the reflection plate from the discharge tube. Accordingly, a current flowing on a low voltage side of the discharge tube is smaller compared with that on a high voltage side, and luminance on the low voltage side also becomes to be lower.

Also, the second task is that in the case a high voltage is input from one side of the discharge tube, it is impossible to effectively turn on the discharge tube. The reason thereof is that as a voltage applied to the discharge tube is higher, a current flowing into the floating capacitor formed between the discharge tube and the reflection plate is more. Assuming that a capacity value of the entire floating capacitor is C, a voltage applied to the discharge tube is V, and an energy for charging and discharging the floating capacitor by means of a flow of a current into the floating capacitor is W, a relation such as an equation (1) is established.

$$W = (1/2) \times C \times V^2 \quad (1)$$

As shown in the equation (1), the energy W for charging and discharging the floating capacitor is proportional to the square of the voltage applied to the discharge tube, and also, since, when the voltage applied to the discharge tube is higher, a reactive power for charging and discharging this floating capacitor increases due to a resistance component of the discharge tube, loss of this power on an output side also increases.

The third task is that although, in case of using a piezoelectric transformer in place of the electromagnetic transformer, two piezoelectric transformers are necessary for inputting high voltages from either side of the discharge tube, it is sometimes impossible to obtain the same output voltages when the two piezoelectric transformers are driven at the same drive frequencies. The reason thereof is as follows: The drive frequencies of the two piezoelectric transformers which are input from the either side of the discharge tube are the same as each other. However, if dispersion exists in each drive frequency of the piezoelectric transformers T1 and T2 and ratios of rise thereof as shown in FIG. 11, that is, generally, since the piezoelectric transformers have high Q, if dispersion of a resonance frequency exists, even the slight dispersion gives the ratios of rise a large difference, and thereby, the drive voltages of the discharge tube becomes to be unbalanced.

SUMMARY OF THE INVENTION

The objective of the present invention is to solve these tasks and to provide a driving circuit and a driving method for reducing luminance non-uniformity of a discharge tube and effectively turning on the discharge tube using piezoelectric transformers.

In a driving method of the present invention, first and second piezoelectric transformers are provided for outputting a voltage at a secondary terminal which is input from a primary terminal utilizing a piezoelectric effect, the first piezoelectric transformer is driven at a required frequency voltage, and the second piezoelectric transformer is driven at a same frequency voltage as that of the first piezoelectric transformer and of which phase is different from that of the first piezoelectric transformer by 180 degrees. And, it is characterized in that an output of the first piezoelectric transformer is applied from a first input terminal of a discharge tube and an output of the second piezoelectric transformer is applied from a second input terminal of the above-described discharge tube, and the above-described discharge tube is turned on.

Also, in the method, the output of the first piezoelectric transformer can be a voltage selected so that a current flowing in the discharge tube becomes constant, and a voltage to be input to the second piezoelectric transformer can be controlled so that output voltages of the first and second piezoelectric transformers become the same voltages.

Moreover, a drive frequency of the first piezoelectric transformer can be controlled so that luminance of the discharge tube becomes to be constant, and a voltage input to the second piezoelectric transformer can be controlled so that output voltages of the first and second piezoelectric transformers become the same voltages.

Also, a driving circuit of the present invention includes first and second piezoelectric transformers for outputting a voltage at a secondary terminal which is input from a primary terminal utilizing a piezoelectric effect, frequency control means for outputting a frequency signal for operating the first piezoelectric transformer at a required frequency voltage, phase reversing means for reversing a phase of the frequency signal from the above-described frequency control means by 180 degrees, and driving circuit means for applying a frequency voltage to each of the above-described piezoelectric transformers. based on the above-described frequency signals of which phases are different from each other by 180 degrees. Furthermore, the driving circuit includes a discharge tube in which an output of the above-described first piezoelectric transformer is applied to a first input terminal and an output of the above-described second piezoelectric transformer is applied to a second input terminal, means for controlling a voltage of the above-described first piezoelectric transformer so that a current flowing in the above-described discharge tube becomes constant, and means for controlling a voltage input to the above-described second piezoelectric transformer so that output voltages of the above-described first and second piezoelectric transformers become the same voltages. Or, the driving circuit includes means for controlling a drive frequency of the above-described first piezoelectric transformer so that luminance of the above-described discharge tube becomes constant, and means for controlling a voltage input to the above-described second piezoelectric transformer so that output voltages of the above-described first and second piezoelectric transformers become the same voltages.

Also, the above-described means for controlling a voltage of the first piezoelectric transformer may include tube current detecting circuit means for detecting a current flowing in the discharge tube, and frequency control circuit means for receiving a detected current from the tube current detecting circuit means and outputting a waveform having a frequency for driving the first piezoelectric transformer.

Moreover, above-described means for controlling a voltage input to the second piezoelectric transformer may include voltage comparing circuit means for comparing an output voltage of the first piezoelectric transformer with an output voltage of the second piezoelectric transformer, and drive voltage control circuit means for receiving a signal representing a compared result from the voltage comparing circuit means and controlling the output voltage of the second piezoelectric transformer so as to be the same as the output voltage of the first piezoelectric transformer.

Further, the above-described means for controlling a drive frequency of the first piezoelectric transformer may include a luminance detecting means for detecting luminance of the discharge tube, and frequency control circuit means for receiving an output from the luminance detecting means and outputting a waveform having a frequency for driving the first piezoelectric transformer.

In this manner, since the two piezoelectric transformers are used, and since a frequency voltage is applied to one of the piezoelectric transformers, which is obtained by detecting luminance of the discharge tube or a value of the current flowing in the discharge tube so that the luminance of the discharge tube becomes to be constant, and a frequency voltage is applied to the other of the piezoelectric transformers so that the other of the piezoelectric transformers outputs an output voltage of which frequency is the same as that of one of the piezoelectric transformer and of which phase is different from that of one of the piezoelectric transformer by 180 degrees, by inputting the high voltages to the different input terminals of the discharge tube, respectively, which output from these piezoelectric transformers, it becomes possible to reduce an amount of a current flowing out of the discharge tube into a floating capacitor and a current flowing from the floating capacitor into the discharge tube, and thereby, luminance non-uniformity of the discharge tube can be reduced.

BRIEF DESCRIPTION OF THE DRAWINGS

This and other objects, features and advantages of the present invention will become more apparent upon a reading of the following detailed description and drawings, in which:

FIGS. 3A–3C are views showing luminance non-uniformity of a discharge tube of the present invention and an amount of a current flowing in a floating capacitor;

FIGS. 10A–10B is a schematic view of a backlight; and

DESCRIPTION OF THE EMBODIMENTS

Figure 1:
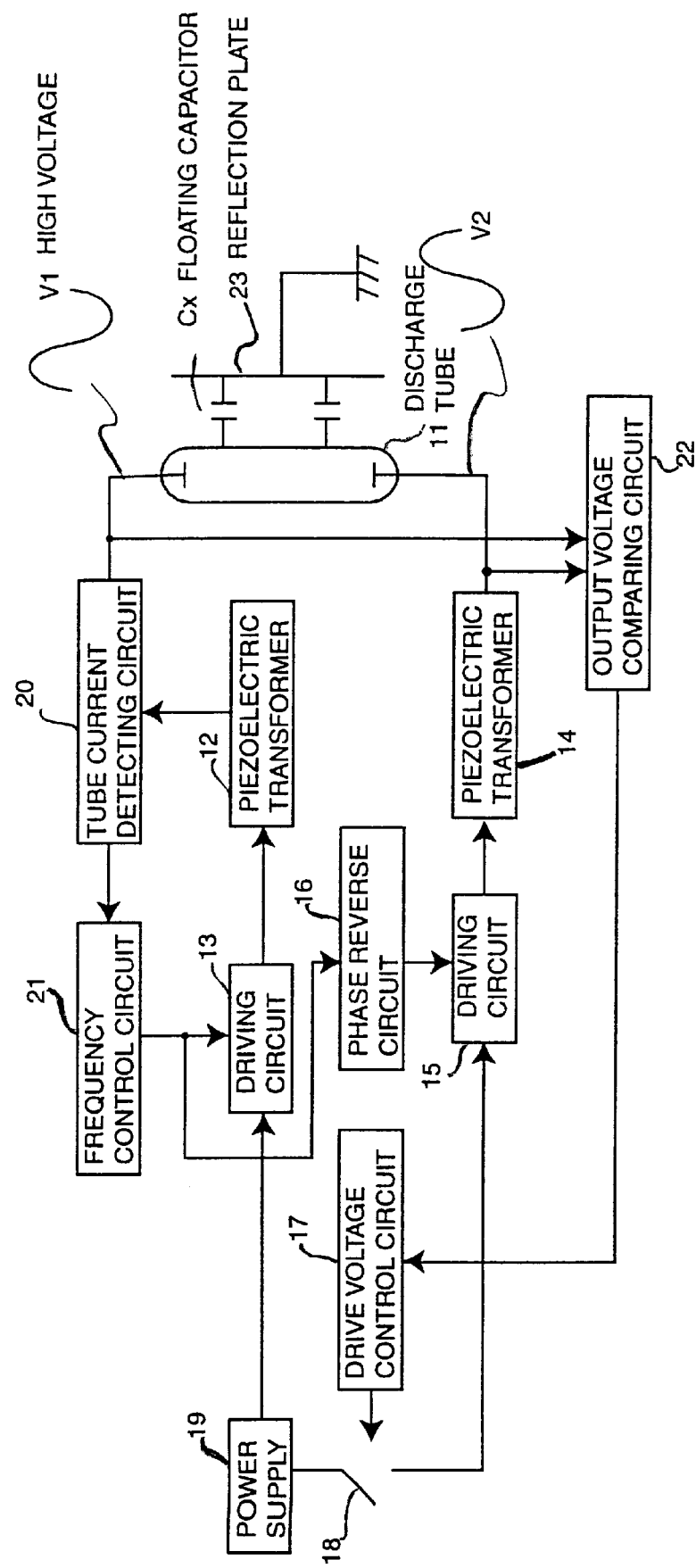
FIG. 1 is a circuit diagram of the first embodiment of a driving circuit of the present invention.

Next, embodiments of the present invention will be explained by referring to the drawings. FIG. 1 is a circuit diagram of a first embodiment of a piezoelectric transformer driving circuit of the present invention. In FIG. 1, an output side of a piezoelectric transformer 14 is connected to one of input terminals of a discharge tube 11, and an output side of a piezoelectric transformer 12 is connected to the other of the input terminals through a tube current detecting circuit 20. Each of the above-described piezoelectric transformers 14 and 12 is driven by driving circuits 15 and 13 connected to a power supply 19, respectively. And, the driving circuit 13 is controlled by an output of a frequency control circuit 21, and the driving circuit 15 is controlled by an output generated by reversing the output of the above-described frequency control circuit 21 by means of a phase reverse circuit 16. Also, outputs of the above-described piezoelectric transformers 14 and 12 are compared with each other at an output voltage comparing circuit 22, and based on a result of this comparison, a drive voltage control circuit 17 turns on and off a switching element 18 connected to the above-described power supply 19, and controls supply of a power to the above-described driving circuit 15. In addition, in the FIG. 1, V1 is a high voltage to be input to one of the discharge tube 11 and V2 is a high voltage to be input to the other of the discharge tube 11, and the high voltages V1 and V2 have the same frequencies and phases thereof are different from each other by 180 degrees. Also, 23 is a reflection plate, and a floating capacitor Cx exists between the reflection plate and the discharge tube 11.

According to this arrangement, when the switching element 18 is being turned on, each of the driving circuits 13 and 15 drives the piezoelectric transformers 12 and 14 by means of the power supply 19, respectively, and voltages from output sides thereof are supplied to the discharge tube 11. At this time, since a current flowing in the above-described discharge tube 11 flows into the tube current detecting circuit 20, the current flowing in the discharge tube 11 is detected at this tube current detecting circuit 20, and a detected value is input to the frequency control circuit 21. Usually, a ratio of rise of a piezoelectric transformer is determined by a frequency for driving the piezoelectric transformer. Accordingly, the frequency control circuit 21 controls a frequency for driving the piezoelectric transformer 12 so that a value of a current flowing in the discharge tube 11 becomes constant at an arbitrary value, and outputs an arbitrary waveform having a frequency for driving the piezoelectric transformer 12. The output of this frequency control circuit 21 is boosted by the driving circuit 13 and is input to the piezoelectric transformer 12. The output of the piezoelectric transformer 12 is input to the tube current detecting circuit 20, and is further applied to the discharge tube 11. Therefore, the output of the piezoelectric transformer 12 that is input to one of the discharge tube 11 conducts control so that a value of a current flowing in the discharge tube 11 becomes to be constant.

On the other hand, if a drive frequency of the piezoelectric transformer 14 is the same as that of the piezoelectric transformer 12 and a phase thereof is different from that of the piezoelectric transformer 12 by 180 degrees, luminance non-uniformity of the discharge tube is difficult to be averaged. Accordingly, with regard to a frequency for driving the piezoelectric transformer 14, an output of the frequency control circuit 21 is reversed by the phase reverse circuit 16, and this output is input to the driving circuit 15 for driving the piezoelectric transformer 14. Thereby, the piezoelectric transformer 12 and the piezoelectric transformer 14 can be driven at the same frequency. However, if drive frequencies at the piezoelectric transformers are dispersed, there is a possibility that an output of the piezoelectric transformer 14 becomes too large or too small. Also, when the outputs of the piezoelectric transformer 12 and the piezoelectric transformer 14 are the same, it is necessary to make the output voltages of the piezoelectric transformer 12 and the piezoelectric transformer 14 to be the same so that luminance non-uniformity of the discharge tube is averaged more. Accordingly, the output voltage of the piezoelectric transformer 12 and the output voltage of the piezoelectric transformer 14 are compared with each other by the voltage comparing circuit 22, and a signal of a comparing result of this output voltage comparing circuit 22 is input to the drive voltage control circuit 17, and by turning on and off a power to be input to the driving circuit 15 from the power supply 19 through the switching element 18 by means of the drive voltage control circuit 17, the output voltage of the piezoelectric transformer 14 is the same as the output voltage of the piezoelectric transformer 12.

Figure 5:
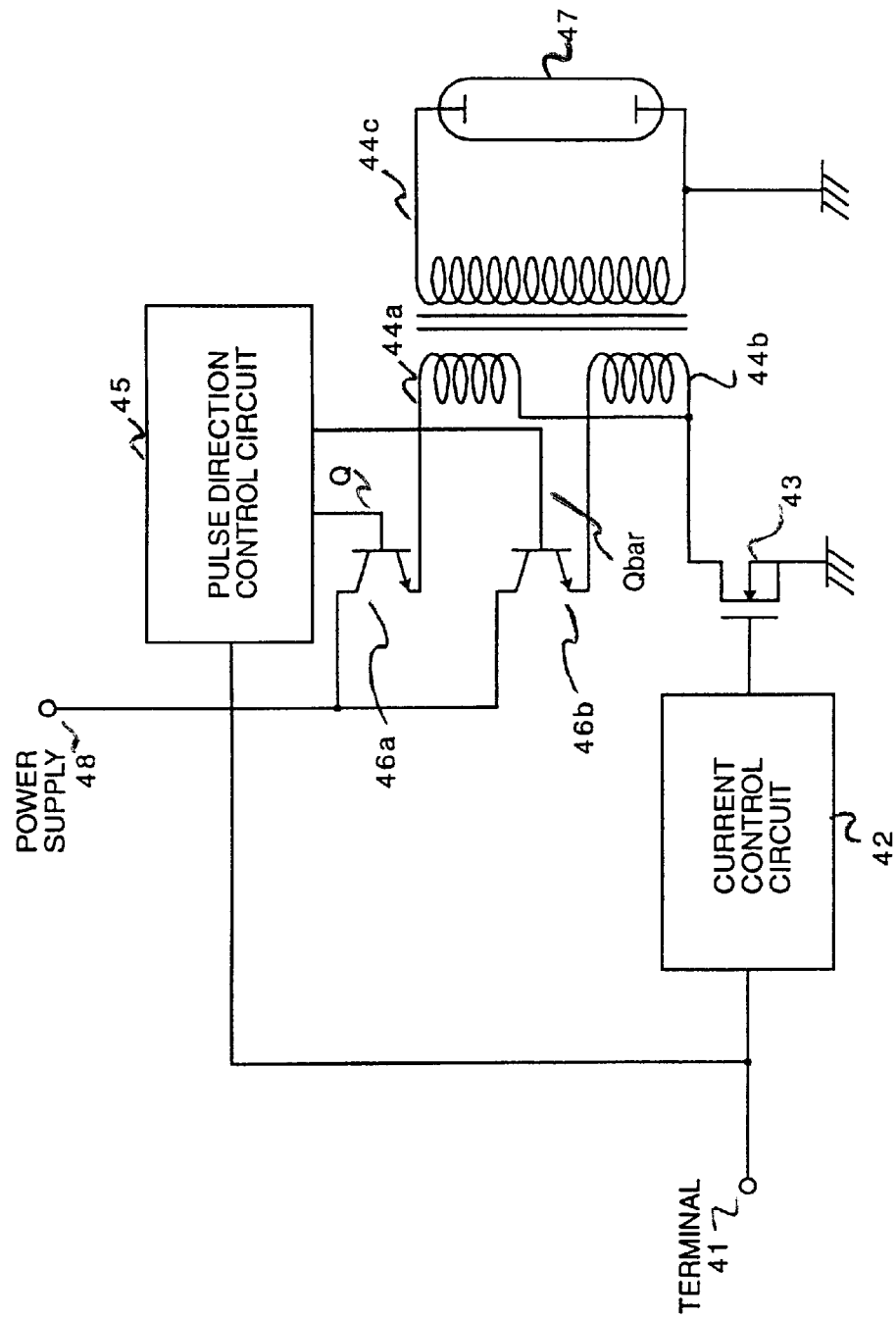
FIG. 5 is a circuit diagram of a driving circuit of the second conventional example.

By conducting such control, voltages of which frequencies are the same and of which phases are different from each other by 180 degrees become to be applied to either terminal of the discharge tube 11, respectively. Assuming that a predetermined voltage for turning on the discharge tube is $VH(V_{0-peak})$, in case that a high voltage is input from one side of the discharge tube like in the art shown in FIG. 5, $VH(V_{0-peak})$ is applied to an electrode on one side of the discharge tube, and since a low voltage side of the discharge tube becomes to be close to a GND voltage, from the equation (1), a charge and discharge energy of the floating capacitor is $$(1/2) \times Cx(VH)^2 \tag{2}.$$

However, in case that high voltages of which phases are different from each other by 180 degrees are input from either input terminal of the discharge tube, $(1/2)VH(0\text{-peak})$ is input to one of the input terminals and a voltage of $(-1/2)VH(0\text{-peak})$ is input to the other of the input terminals. Also, since a center of the discharge tube becomes to be a GND voltage, a charge and discharge energy of the floating capacitor is $$2 \times (1/2) \times (C/2) \times (VH/2)^2 \tag{3},$$

and is one forth of the case in which a high voltage is input from one side of the discharge tube.

Figure 2:
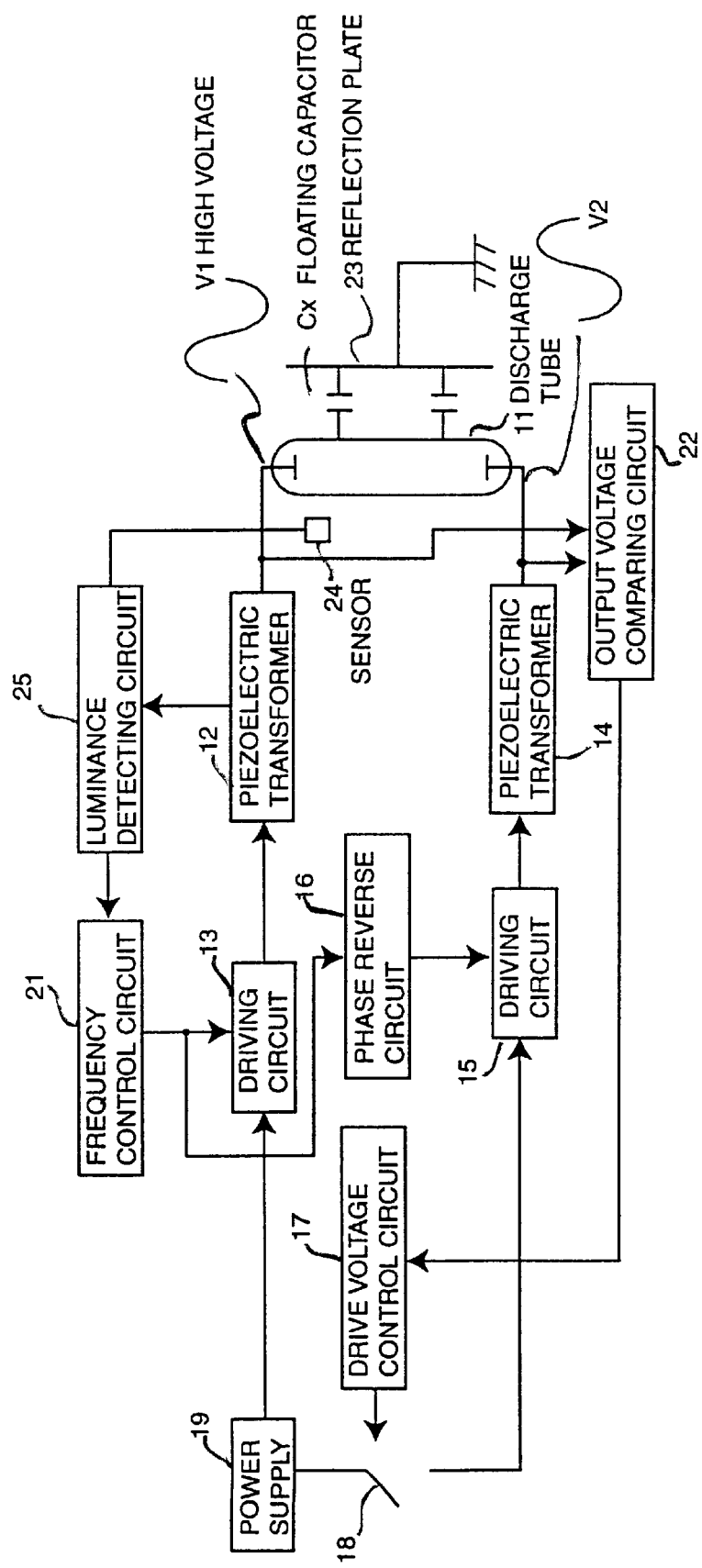
FIG. 2 is a circuit diagram of the second embodiment of a driving circuit of the present invention.
Figure 4:
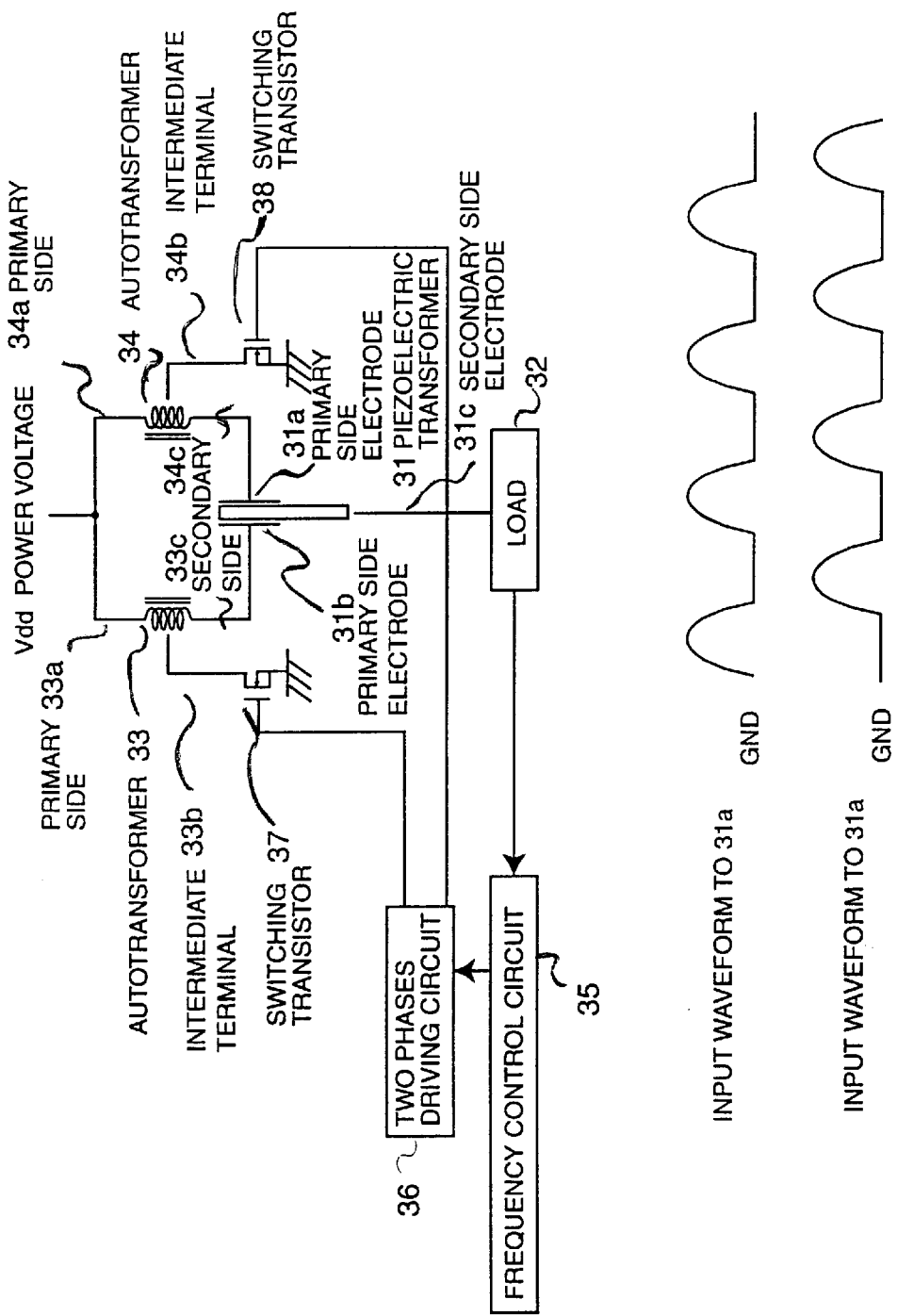
FIG. 4 is a circuit diagram of a driving circuit of the first conventional example and a view showing waveforms thereof.
Figure 6:
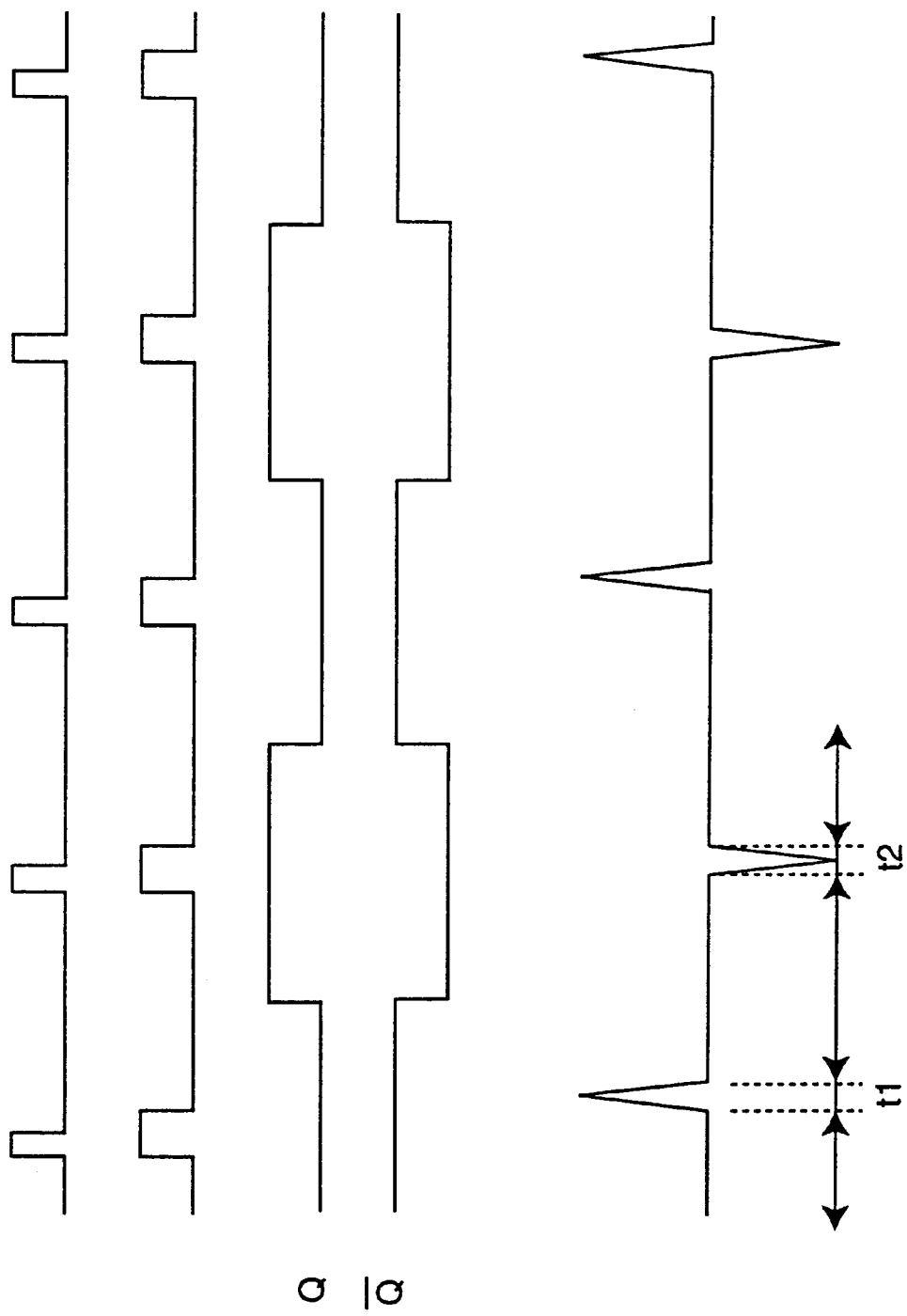
FIGS. 6A–6E is signal waveform diagrams in the second conventional example.
Figure 7:
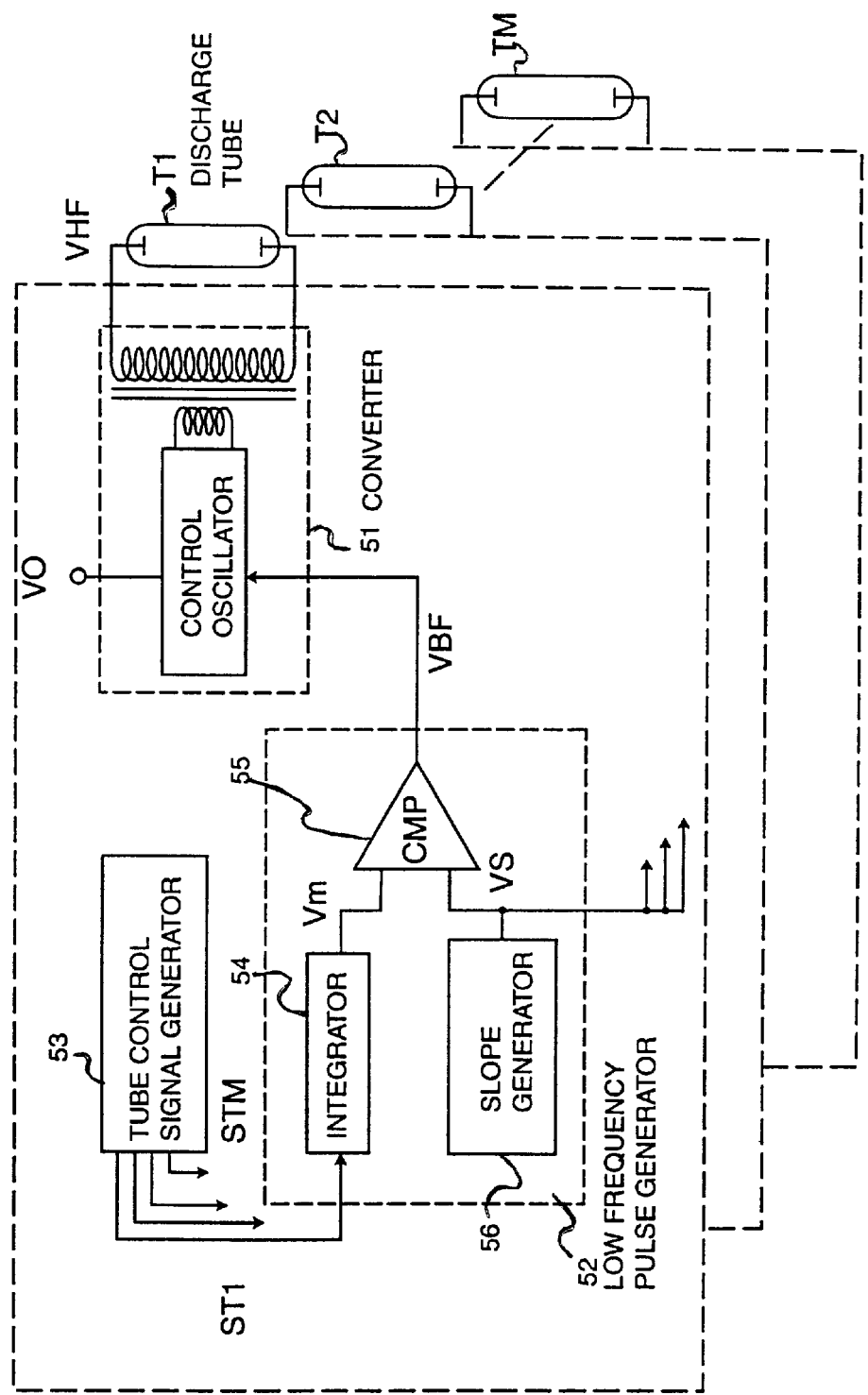
FIG. 7 is a circuit diagram of a driving circuit of the third conventional example.
Figure 8A:
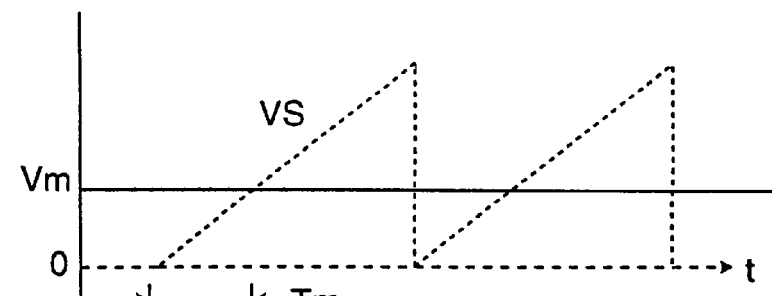
FIGS. 8A–8D is first signal waveform diagrams in the third conventional example.
Figure 8B:
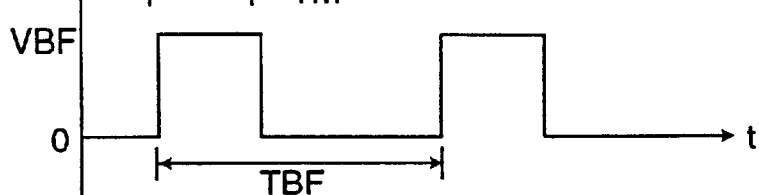
Figure 8C:
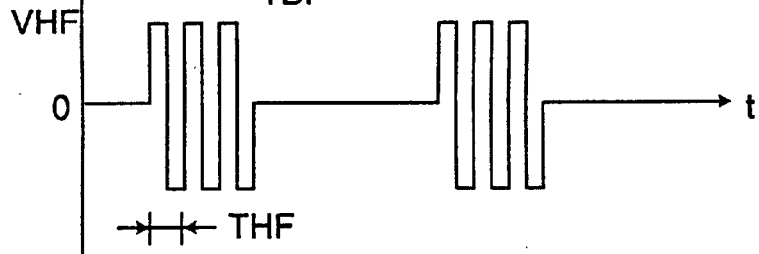
Figure 8D:
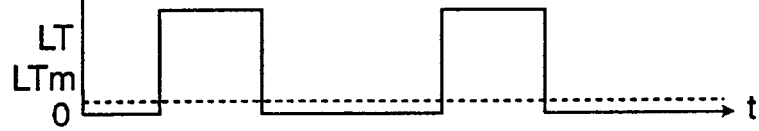
Figure 9:
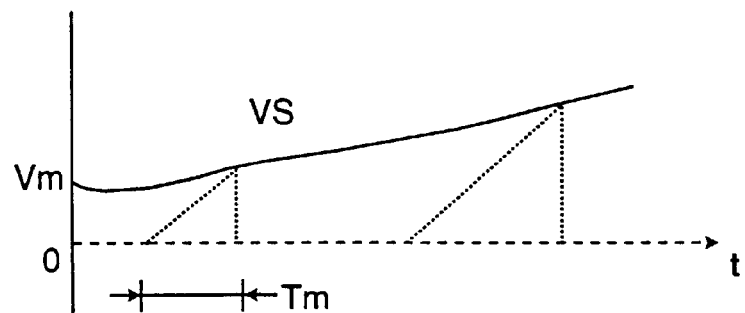
FIGS. 9A–9D is a second signal waveform diagram in the third conventional example.
Figure 9:
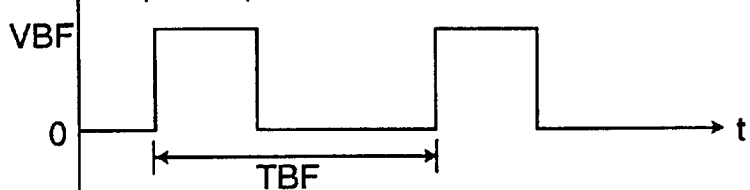
Figure 9:
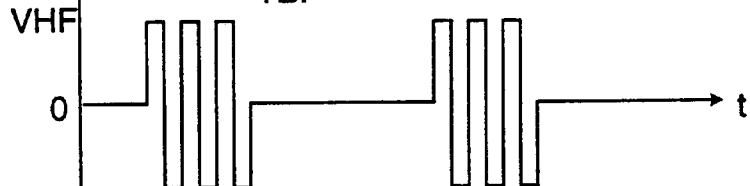
Figure 9:
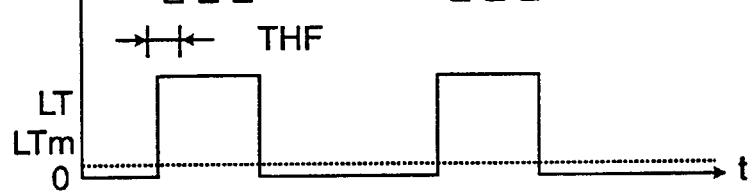
Figure 11:
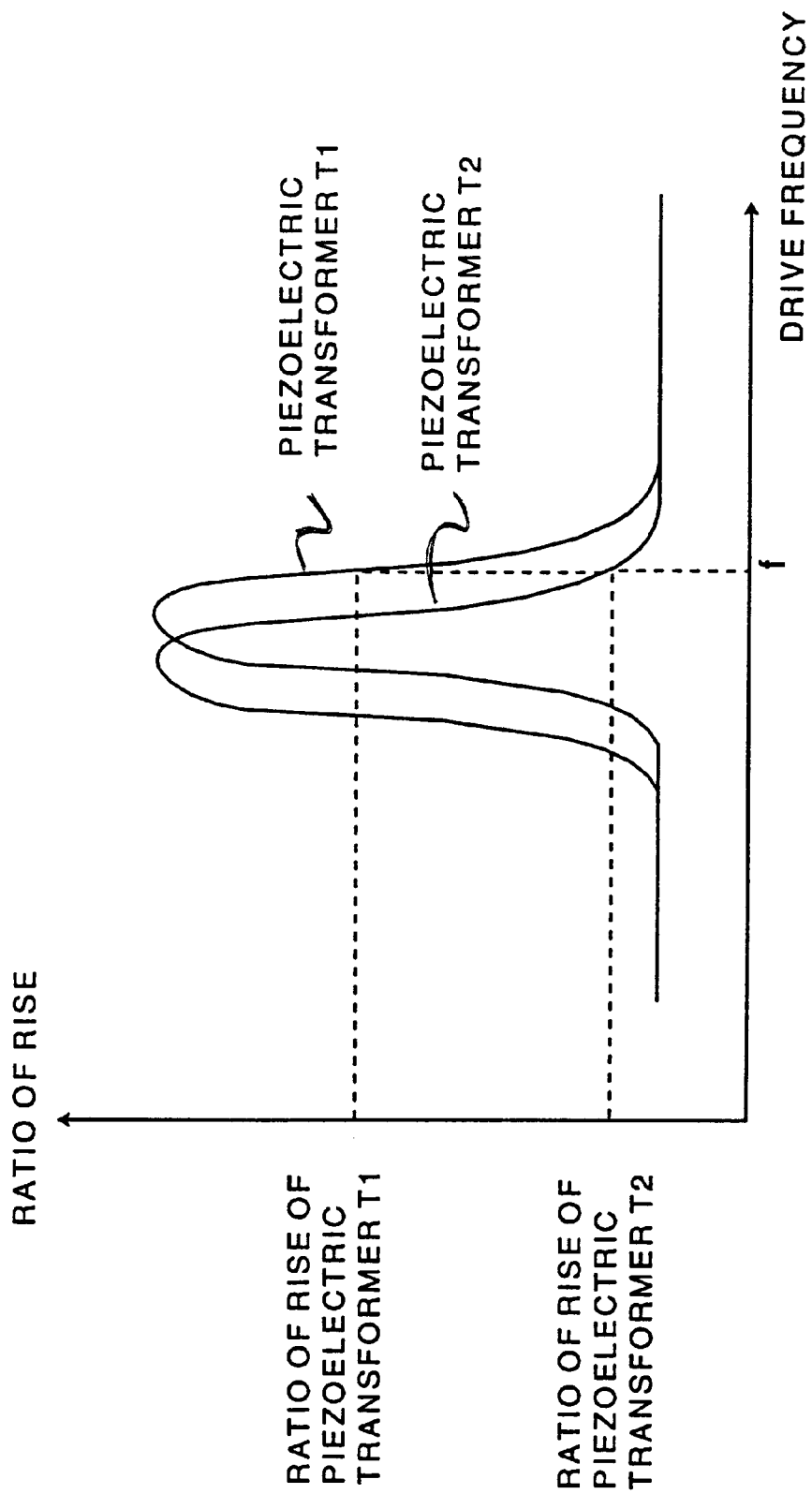
FIG. 11 is a view showing a relation between a drive frequency and a ratio of rise of a piezoelectric transformer.

A current flowing in the discharge tube is shown in FIG. 3A for a period t1 of FIG. 6E that shows an input waveform of the discharge tube described in JP-A-20783/1994. Also, since luminance of the discharge tube is proportional to an amount of a current flowing in the discharge tube, the luminance of the discharge tube also exhibits a distribution as shown in FIG. 3A. Although, for a period t2 of FIG. 6E, a high voltage applied to the discharge tube is situated on an opposite side for the period t1, an absolute value of a current flowing in the discharge tube exhibits a distribution as shown in FIG. 3A like for the period t1, and also, the luminance exhibits a distribution as shown in FIG. 3A. In case that high voltages of which frequencies are the same and of which phases are different from each other by 180 degrees are input from either terminal of the discharge tube, since a center of the discharge tube becomes to be a GND voltage, a current flowing out of the discharge tube into a floating capacitor becomes to be as shown in FIG. 3B, and in taking account of a current that does not flowing into the floating capacitor from the discharge tube, since a distribution of a current flowing in the discharge tube becomes to be as shown in FIG. 3C, a distribution of luminance of the discharge tube also becomes to be as shown in FIG. 3C. Therefore, if high voltages of which phases are different from each other by 180 degrees are input from either side-of the discharge tube, luminance non-uniformity of the discharge tube can be reduced. Next, using FIG. 2, a second embodiment of the present invention will be explained. In FIG. 2, the same symbols are attached to equivalent parts in FIG. 1. In this embodiment, an output side of the piezoelectric transformer 12 is directly input to the other input terminal of the discharge tube 11, and the tube current detecting circuit 20 used in the first embodiment is omitted, and instead, a luminance detecting sensor 24 for detecting luminance of the discharge tube 11 and a luminance detecting circuit 25 connected to this luminance detecting sensor 24 are provided and a detection value thereof is input to the frequency control circuit 21.

A frequency for driving the piezoelectric transformer 12 of this FIG. 2 is determined as follows: Luminance of the discharge tube 11 is monitored by the luminance detecting sensor 24, and an output from this luminance detecting sensor 24 is input to the frequency control circuit 21 through the luminance detecting circuit 25. As described above, since a ratio of rise of a piezoelectric transformer is determined by a frequency for driving the piezoelectric transformer, the frequency control circuit 21 controls a frequency for driving the piezoelectric transformer 12 so that luminance of the discharge tube 11 becomes to be constant at an arbitrary value, and outputs an arbitrary waveform having a frequency for driving the piezoelectric transformer 12. After the output of this frequency control circuit 21 is boosted by the driving circuit. 13, a boosted output is input to the piezoelectric transformer 12, and is further boosted by the piezoelectric transformer 12 and is applied to the discharge tube 11.

In addition, a frequency for driving the piezoelectric transformer 14 is determined like in the above-described first embodiment. Also, a drive voltage of the piezoelectric transformer 14 is controlled in the same manner. Therefore, distributions of luminance and a current flowing in the discharge tube are the same as in the first embodiment shown in FIG. 3, and as a result, high voltages of which phases are different from each other by 180 degrees are input from either side of the discharge tube, and luminance non-uniformity of the discharge tube can be reduced.

As explained above, in the present invention, by driving the first and second piezoelectric transformers by means of the same frequency voltages of which phases are different from each other by 180 degrees, respectively, high voltages of reverse phases are output from each of the piezoelectric transformers, and by inputting the output voltages-to either input terminal of the discharge tube, luminance non-uniformity of the discharge tube can be reduced. Also, thereby, a voltage applied to the discharge tube becomes to be lower compared with Gm, and it becomes to be possible to efficiently drive the discharge tube.

The entire disclosure of Japanese Patent Application No. 9-162781 filed on Jun. 19, 1997 including specification, claims, drawing and summary are incorporated herein by reference in its entirety.

What is claimed is:

1. A method of supplying power to a discharge tube such that the discharge tube has a constant luminance throughout its length, said method comprising steps of:

driving a first piezoelectric transformer at a frequency voltage;

driving a second piezoelectric transformer at a same frequency voltage as said first piezoelectric transformer and 180 degrees out of phase;

applying an output of said first piezoelectric transformer to a first input terminal at a first end of said discharge tube; and applying an output of said second piezoelectric transformer to a second input terminal at an opposite end of said discharge tube to turn on said discharge tube.

2. A driving method according to claim 1, wherein said output of said first piezoelectric transformer is a voltage selected so that a current flowing in said discharge tube is constant, and a voltage to be input to said second piezoelectric transformer is controlled so that output voltages of said first and second piezoelectric transformers are the same voltages.

3. A driving method according to claim 1, wherein a drive frequency of said first piezoelectric transformer is controlled so that luminance of said discharge tube is constant, and a voltage input to said second piezoelectric transformer is controlled so that output voltages of said first and second piezoelectric transformers are the same voltages.

4. A driving circuit for piezoelectric transformers supplying power to a discharge tube having a constant luminance throughout its length, comprising:

first and second piezoelectric transformers;

frequency control means for outputting a frequency signal for operating said first piezoelectric transformer at a required frequency voltage;

phase reversing means for reversing a phase of the frequency signal by 180 degrees for outputting a reversed frequency signal;

first driving circuit means for driving said first piezoelectric transformer with said frequency signal and second driving circuit means for driving said second piezoelectric transformer with said reversed frequency signal, wherein outputs of said first and second piezoelectric transformers are applied to opposite input terminals of a discharge tube, respectively.

5. A driving circuit for piezoelectric transformers according to claim 4, further comprising:

means for controlling a voltage of said first piezoelectric transformer so that a current flowing in said discharge tube is constant; and means for controlling a voltage input to said second piezoelectric transformer so that output voltages of said first and second piezoelectric transformers are the same voltages.

6. A piezoelectric transformer driving circuit for powering a discharge tube having a constant luminance value along it length, comprising:

first and second piezoelectric transformers;

frequency control means for outputting a frequency signal for operating said first piezoelectric transformer at a frequency voltage;

phase reversing means for reversing a phase of the frequency signal by 180 degrees to output a reversed frequency signal;

first driving means for driving said first piezoelectric transformer with said frequency signal;

second driving means for driving said second piezoelectric transformer with said reversed frequency signal;

a discharge tube comprising first and second power input terminals at opposite ends thereof, said first piezoelectric transformer supplying power to said first input terminal and said second piezoelectric transformer supplying power to said second power terminal;

means for controlling a voltage of said first piezoelectric transformer so that a current flowing in said discharge tube is constant; and means for controlling a voltage input to said second piezoelectric transformer so that output voltages of said first and second piezoelectric transformers become are the same voltages.

7. A piezoelectric transformer driving circuit according to claim 6, wherein said means for controlling a voltage of said first piezoelectric transformer comprises:

tube current detecting circuit means for detecting a current flowing in said discharge tube; and frequency control circuit means for receiving a detected current from said tube current detecting circuit means and outputting a waveform having a frequency for driving said first piezoelectric transformer.

8. A piezoelectric transformer driving circuit according to claim 6, wherein said means for controlling a voltage input to said second piezoelectric transformer comprises:

voltage comparing circuit means for comparing an output voltage of said first piezoelectric transformer with an output voltage of said second piezoelectric transformer; and drive voltage control circuit means for receiving a signal representing a compared result from said voltage comparing circuit means and controlling said output voltage of said second piezoelectric transformer so as to be the same as said output voltage of said first piezoelectric transformer.

9. A piezoelectric transformer driving circuit for powering a discharge tube having a constant luminance value along it length, comprising:

first and second two piezoelectric transformers;

frequency control means for outputting a frequency signal for operating said first piezoelectric transformer at a required frequency voltage;

phase reversing means for reversing a phase of the frequency signal by 180 degrees to output a reversed frequency signal;

first driving circuit means for driving said first piezoelectric transformer with said frequency signal;

second driving means for driving said second piezoelectric transformer with said reversed frequency signal;

a discharge tube in which an output of said first piezoelectric transformer is applied to a first input terminal at a first end of said discharge tube, and an output of said second piezoelectric transformer is applied to a second input terminal at a second end of said discharge tube;

means for controlling a drive frequency of said first piezoelectric transformer so that luminance of said discharge tube is constant; and means for controlling a voltage input to said second piezoelectric transformer so that output voltages of said first and second piezoelectric transformers are the same voltages.

10. A piezoelectric transformer driving circuit according to claim 9, wherein said means for controlling a drive frequency of said first piezoelectric transformer comprises:

a luminance detecting means for detecting luminance of said discharge tube; and frequency control circuit means for receiving an output from said luminance detecting means and outputting a waveform having a frequency for driving said first piezoelectric transformer.

11. A piezoelectric transformer driving circuit according to claim 9, wherein said means for controlling a voltage input to said second piezoelectric transformer comprises:

voltage comparing circuit means for comparing an output voltage of said first piezoelectric transformer with an output voltage of said second piezoelectric transformer; and drive voltage control circuit means for receiving a signal representing a compared result from said voltage comparing circuit means and controlling said output voltage of said second piezoelectric transformer so as to be the same as said output voltage of said first piezoelectric transformer.

12. A circuit for illuminating a discharge tube with a constant luminance throughout its length, comprising:

a discharge tube having a first input terminal at first end and a second input terminal at a second end, opposite said first end;

first piezoelectric transformer connected to supply power to said first input terminal;

second piezoelectric transformer connected to supply power to said second input terminal;

first and second driving circuits respectively connecting said first and second piezoelectric transformers to a power supply;

voltage comparison circuit for comparing the voltage supplied to the discharge tube by the first and second piezoelectric transformers and outputting a comparison signal;

switch means for connecting and disconnecting said second drive circuit from said power supply in response to said comparison signal such that output voltage of said second piezoelectric transformer matches output voltage of the first piezoelectric transformer;

frequency control means for driving said first and said second drive circuits with a frequency signal 180° out of phase with each other; and one of a current detection circuit for detecting the current through said discharge tube and a luminance detector for detecting a luminance value from said discharge tube, for controlling said frequency driving said first and said second drive circuits, whereby said discharge tube has a constant luminance throughout its length.

13. A circuit for illuminating a discharge tube with a constant luminance throughout its length as recited in claim 12, further comprising:

a grounded reflection plate capacitively connected to said discharge tube.

14. A method for illuminating a discharge tube with a constant luminance throughout its length, comprising the steps of:

providing a discharge tube having a first input terminal at a first end and a second input terminal at a second end, opposite said first end;

supplying power to said first input terminal with a first transformer operating at a first frequency; and supplying power to said second input terminal with a second transformer operating at a second frequency, said second frequency being 180° out of phase to said first frequency.

* * * * *